United States Patent
Zhang

(10) Patent No.: US 9,728,379 B2
(45) Date of Patent: Aug. 8, 2017

(54) PLASMA PROCESSING APPARATUS

(75) Inventor: Fenggang Zhang, Beijing (CN)

(73) Assignee: Beijing NMC Co., Ltd., Beijing (CN)

( * ) Notice: Subject to any disclaimer, the term of this patent is extended or adjusted under 35 U.S.C. 154(b) by 393 days.

(21) Appl. No.: 13/119,106

(22) PCT Filed: Sep. 3, 2009

(86) PCT No.: PCT/CN2009/073714
§ 371 (c)(1),
(2), (4) Date: Mar. 15, 2011

(87) PCT Pub. No.: WO2010/031307
PCT Pub. Date: Mar. 25, 2010

(65) Prior Publication Data
US 2011/0162801 A1    Jul. 7, 2011

(30) Foreign Application Priority Data
Sep. 16, 2008 (CN) .......................... 2008 1 0222421

(51) Int. Cl.
*C23C 14/50* (2006.01)
*H01L 21/67* (2006.01)
(Continued)

(52) U.S. Cl.
CPC ........ *H01J 37/32568* (2013.01); *C23C 14/50* (2013.01); *H01J 37/32009* (2013.01);
(Continued)

(58) Field of Classification Search
CPC .................. C23C 14/568; C23C 14/50; C23C 16/4583–16/4586; F27D 5/0037;
(Continued)

(56) References Cited

U.S. PATENT DOCUMENTS 4,553,069 A * 11/1985 Purser ...................... 315/111.81
4,605,233 A *  8/1986 Sato .......................... F16J 15/43
277/410
(Continued)

FOREIGN PATENT DOCUMENTS

CN          1225747 A      8/1999
CN        101351076 A      1/2009
EP          807694 A1  * 11/1997

OTHER PUBLICATIONS

F. M. White "Fluid Mechanics 4th Edition," McGraw-Hill, New York, NY, US, Dec. 28, 1998, Chapter 7, pp. 426-492.*
(Continued)

*Primary Examiner* — Jeffrie R Lund
*Assistant Examiner* — Stanislav Antolin
(74) *Attorney, Agent, or Firm* — Locke Lord LLP; Howard M. Gitten

(57) ABSTRACT

A plasma processing apparatus (5) comprises an outer shell (51) which is provided with a reaction chamber (52) in the interior, a bottom electrode which is arranged in the reaction chamber (52) and a cantilever support device (53) which goes through the outer shell (51) and supports the bottom electrode. The cantilever support device (53) is pivotally mounted on the side wall of the outer shell (51) and can rotate in the outer shell (51). The plasma processing apparatus (5) further comprises a locating device so as to selectively fix the relative position of the cantilever support device (53) and the outer shell (51).

9 Claims, 6 Drawing Sheets

(51) Int. Cl.
*H01J 37/32* (2006.01)
*H01L 21/683* (2006.01)
*H01L 21/687* (2006.01)

(52) U.S. Cl.
CPC .. *H01J 37/32605* (2013.01); *H01J 37/32715* (2013.01); *H01L 21/6831* (2013.01); *H01L 21/68785* (2013.01); *H01L 21/68792* (2013.01); *H01L 21/67069* (2013.01)

(58) Field of Classification Search
CPC .......... H01J 37/32009; H01J 37/32522; H01J 37/32568; H01J 37/32623; H01J 37/32715; H01J 37/32532–37/32614; H01J 37/32605; H01J 37/32798; H01J 37/32807; H01J 37/3288; H01L 21/67069; H01L 21/6719; H01L 21/6831; H01L 21/68764; H01L 21/68785; H01L 21/68792; H01L 21/6833
USPC ........... 118/726, 728, 733, 715, 723 R, 729; 156/345.31, 345.43, 345.51, 345.1
See application file for complete search history.

(56) References Cited

U.S. PATENT DOCUMENTS

| | | | | |
|---|---|---|---|---|
| 4,869,801 A | * | 9/1989 | Helms et al. | 204/298.15 |
| 4,951,601 A | * | 8/1990 | Maydan et al. | 118/719 |
| 5,000,113 A | * | 3/1991 | Wang et al. | 118/723 E |
| 5,429,705 A | * | 7/1995 | Mahler et al. | 156/345.43 |
| 5,661,093 A | * | 8/1997 | Ravi et al. | 438/763 |
| 5,708,556 A | * | 1/1998 | van Os | C23C 16/4586 361/234 |
| 5,767,628 A | * | 6/1998 | Keller et al. | 315/111.51 |
| 5,820,723 A | * | 10/1998 | Benjamin et al. | 156/345.51 |
| 5,885,423 A | * | 3/1999 | Guyot | 204/298.15 |
| 5,898,179 A | * | 4/1999 | Smick et al. | 250/492.21 |
| 5,948,704 A | | 9/1999 | Benjamin et al. | |
| 6,077,357 A | * | 6/2000 | Rossman et al. | 118/728 |
| 6,083,344 A | * | 7/2000 | Hanawa | H01J 37/321 156/345.28 |
| 6,132,517 A | * | 10/2000 | Sivaramakrishnan et al. | 118/719 |
| 6,176,667 B1 | * | 1/2001 | Fairbairn et al. | 414/217 |
| 6,182,602 B1 | * | 2/2001 | Redeker | C23C 16/507 118/715 |
| 6,377,437 B1 | * | 4/2002 | Sexton et al. | 361/234 |
| 6,395,095 B1 | * | 5/2002 | Jones et al. | 118/728 |
| 6,700,089 B1 | | 3/2004 | Hirooka | |
| 8,257,548 B2 | * | 9/2012 | Tappan | 156/345.54 |
| 8,552,334 B2 | * | 10/2013 | Tappan et al. | 219/121.48 |
| 8,968,474 B2 | * | 3/2015 | Lim et al. | 118/715 |
| 2001/0045262 A1 | * | 11/2001 | Gujer et al. | 156/345 |
| 2002/0000198 A1 | * | 1/2002 | Ishikawa et al. | 118/715 |
| 2005/0051102 A1 | * | 3/2005 | Sato et al. | 118/729 |
| 2005/0066902 A1 | * | 3/2005 | Fink | 118/729 |
| 2005/0120956 A1 | * | 6/2005 | Suzuki | 118/719 |
| 2006/0180968 A1 | * | 8/2006 | Kim et al. | 269/51 |
| 2008/0171444 A1 | * | 7/2008 | Dhindsa et al. | 438/729 |
| 2008/0178810 A1 | * | 7/2008 | Koizumi et al. | 118/730 |
| 2008/0190364 A1 | * | 8/2008 | Mahon et al. | 118/500 |
| 2009/0199766 A1 | * | 8/2009 | Tappan | 118/723.1 |
| 2009/0200268 A1 | * | 8/2009 | Tappan et al. | 216/67 |
| 2009/0301657 A1 | * | 12/2009 | Tappan | 156/345.43 |
| 2012/0091871 A1 | * | 4/2012 | Lim et al. | 312/319.1 |

OTHER PUBLICATIONS

Erik Oberg; Franklin D. Jones; Holbrook L. Horton; & Henry H. Ryffel (2004). Machinery's Handbook (27th Edition) & Guide to Machinery's Handbook, Industrial Press, pp. 1167-1683.*
Rigaku Vacuum Products Catalog. "Magnetic Fluid Sealing for Vacuum and Other Environments: Magnetic Rotary Motion Feedthrough Units." pp. 71. Jul. 2008. Source location: Rigaku Vacuum Products Division http://www.rigaku.com/vacuum/. Available: httpwww.rigaku.comvacuummediaRigakuCatalog.pdf. Accessed: Feb. 15, 2016.*
Form PCT/ISA/210, International Search Report for PCT/CN2009/073714.

* cited by examiner

PLASMA PROCESSING APPARATUS

CROSS-REFERENCES TO RELATED APPLICATIONS

This application is a U.S. national phase application, pursuant to 35 U.S.C. §371, of PCT/CN2009/073714, filed Sep. 3, 2009, designating the United States, which claims the benefit of Chinese Application No. 200810222421.3, filed Sep. 16, 2009. The entire contents of the aforementioned patent applications are incorporated herein by this reference.

TECHNICAL FIELD

The present invention relates to a micro-electronics technical field, particularly to a plasma processing apparatus for processing by means of plasma.

BACKGROUND

Plasma processing apparatuses are widely used in the micro-electronics technical field.

Referring to FIG. 1, FIG. 1 is a schematic diagram showing a construction of a plasma processing apparatus.

The plasma processing apparatus generally comprises an outer shell (not added with a reference number in the figure), in which a reaction chamber 30 is formed. The reaction chamber 30 has a top lid (not shown in the figure) on the top and a vacuum pump 10 under the bottom. A side wall of the outer shell is provided with an opening which commonly takes a square shape. A cantilever support device 90 is inserted through the opening and is fixed on the outer shell while the opening is closed. A part of the cantilever support device 90 located in the reaction chamber 30 is a connection arm 80. A bottom electrode 70 is mounted at an end of the connection arm 80. A support element (not added with a reference number in the figure) is provided on the top of the bottom electrode 70 to support a workpiece; a detachable cover board 12 is provided on the bottom of the bottom electrode 70. Apparently, the plasma processing apparatus 1 can has different constructions.

A workpiece can be transmitted to the support element provided on the top of the bottom electrode 70 via a transmitting port 16. A nearly vacuum state can be created and kept in the reaction chamber 30 by the vacuum pump 10. In such a state, gas is input uniformly into the reaction chamber 30 through a gas distribution device (not shown in the figure), and appropriate RF is input into the reaction chamber 30 to excite the gas, and thus a plasma environment can be created and kept on the surface of the workpiece. Since the plasma has a strong ability of etching and deposition, physical or/and chemical reactions such as etching or/and deposition can be carried out between the plasma and the workpiece to achieve an etching pattern or a deposition layer as desired. By-products of the physical or/and chemical reactions above-mentioned are drawn out from an opening 20 on the bottom of the reaction chamber 30 by the vacuum pump 10.

The bottom electrode 70 needs to be maintained after a certain time of operation. At this time, the cantilever support device 90 and the bottom electrode 70 can be taken out from the opening on the side wall of the outer shell as a whole, and then the cover board 12 is detached from the bottom electrode 70 to maintain the related parts in an inner cavity of the bottom electrode 70. When the maintenance operation is finished, the cover board 12 needs to be mounted on the bottom of the bottom electrode 70, and the cantilever support device 90 and the bottom electrode 70 need to be re-mounted from the opening on the side wall of the outer shell. Only in such a way, the plasma processing apparatus can be put into operation again.

Apparently, the maintenance operation above-mentioned relates to several detaching and mounting operations, and especially the bottom electrode 70 needs to be taken out from the reaction chamber 30, which makes the maintenance operation more complex, and wastes time and energy. On the other hand, the maintenance operation during the operation of the plasma processing apparatus is relatively frequent, which makes a total time of standby maintenance of the overall apparatus long and decreases service efficiency of the apparatus. Thus, the above-mentioned plasma processing apparatus has high maintenance cost and low service efficiency. At present, skilled persons in the art need to solve technical problems on how to simplify the process of maintenance operation of a plasma processing apparatus so as to save the maintenance cost and to increase the service efficiency of the plasma processing apparatus.

SUMMARY OF THE INVENTION

It is an object of the present invention to provide a plasma processing apparatus having a simple process of maintenance operation, so as to save the maintenance cost and to significantly increase the service efficiency of the plasma processing apparatus.

To solve the technical problem above-mentioned, the present invention provides a plasma processing apparatus comprising: an outer shell provided with a reaction chamber in its interior; a bottom electrode arranged in the reaction chamber; and a cantilever support device laterally going through a side wall of the outer shell, an inner end of the cantilever support device being located in the reaction chamber and supporting the bottom electrode. The cantilever support device is pivotally mounted on the side wall of the outer shell so as to rotate in the outer shell. The plasma processing apparatus further comprises a locating device so as to selectively fix the relative position of the cantilever support device and the outer shell.

Further, the locating device includes a flange part fixed on an outer end of the cantilever support device, and the flange part and the outer shell are respectively provided with locating pins and pin-holes matched each other.

Further, the cantilever support device is pivotally mounted on the side wall of the outer shell by a bearing.

Further, a sealing component is arranged between the cantilever support device and the outer shell.

Further, the side wall of the outer shell is provided with a circular stepped hole having a step plane facing towards the outside, and the bearing is arranged in the circular stepped hole. The sealing component is particularly a sealing ring and is arranged between the cantilever support device and the step plane of the circular stepped hole.

Further, the bearing is a magnetic fluid sealing bearing.

Further, the cross section of a part of the cantilever support device located in the reaction chamber has the shape of a circle.

Further, the cross section of a part of the cantilever support device located in the reaction chamber has substantially the shape of an ellipse, and the major axis of the ellipse substantially vertically extends under a normal operation state.

Further, the cantilever support device comprises a cavity extending along the axis direction of the cantilever support device in its interior, and the cavity is communicated with an inner cavity of the bottom electrode.

According to the plasma processing apparatus provided by the present invention, the cantilever support device is pivotally mounted on the side wall of the outer shell, and thus the cantilever support device can rotate in the outer shell. So along with the cantilever support device, the bottom electrode fixed to it can rotate around a substantially horizontal axis in the reaction chamber. When the bottom electrode needs to be maintained, firstly, the locating device is operated to release the fixed relation between the cantilever support device and the outer shell, and then the cantilever support device is rotated about 180 degree, apparently, the bottom electrode will be rotated 180 degree around the axis above-mentioned also; then the relative position of the cantilever support device and the outer shell is re-fixed by the locating device. At this time, a bottom cover of the bottom electrode is substantially vertically upward. Once the bottom cover of the bottom electrode and the related parts on the top of the reaction chamber have been removed, a maintenance operation can be performed from above on the related parts in the inner cavity of the bottom electrode. When the maintenance operation is finished, these same steps in reverse order are taken, that is, the bottom electrode is rotated 180 degree again back to a normal operation position, and the plasma processing apparatus can be recovered into a normal operation state rapidly. During the maintenance operation, the step of taking the bottom electrode out from the reaction chamber is omitted by the plasma processing apparatus provided by the present invention, and presence of such a step is one important reason for the maintenance operation of the prior plasma processing apparatus being relatively complex. Thus, the plasma processing apparatus provided by the present invention simplifies the maintenance operation, reduces the maintenance cost and the maintenance time, and the service efficiency of the plasma processing apparatus is increased significantly.

DETAILED DESCRIPTION

The main point of the present invention is to provide a plasma processing apparatus with a relatively simple maintenance operation so as to save the maintenance cost and to increase the service efficiency of a plasma processing apparatus significantly.

For better understanding of the solution of the present invention by the persons skilled in the art, the present invention will be described in detail by reference to the drawings and the embodiments.

Figure 1:
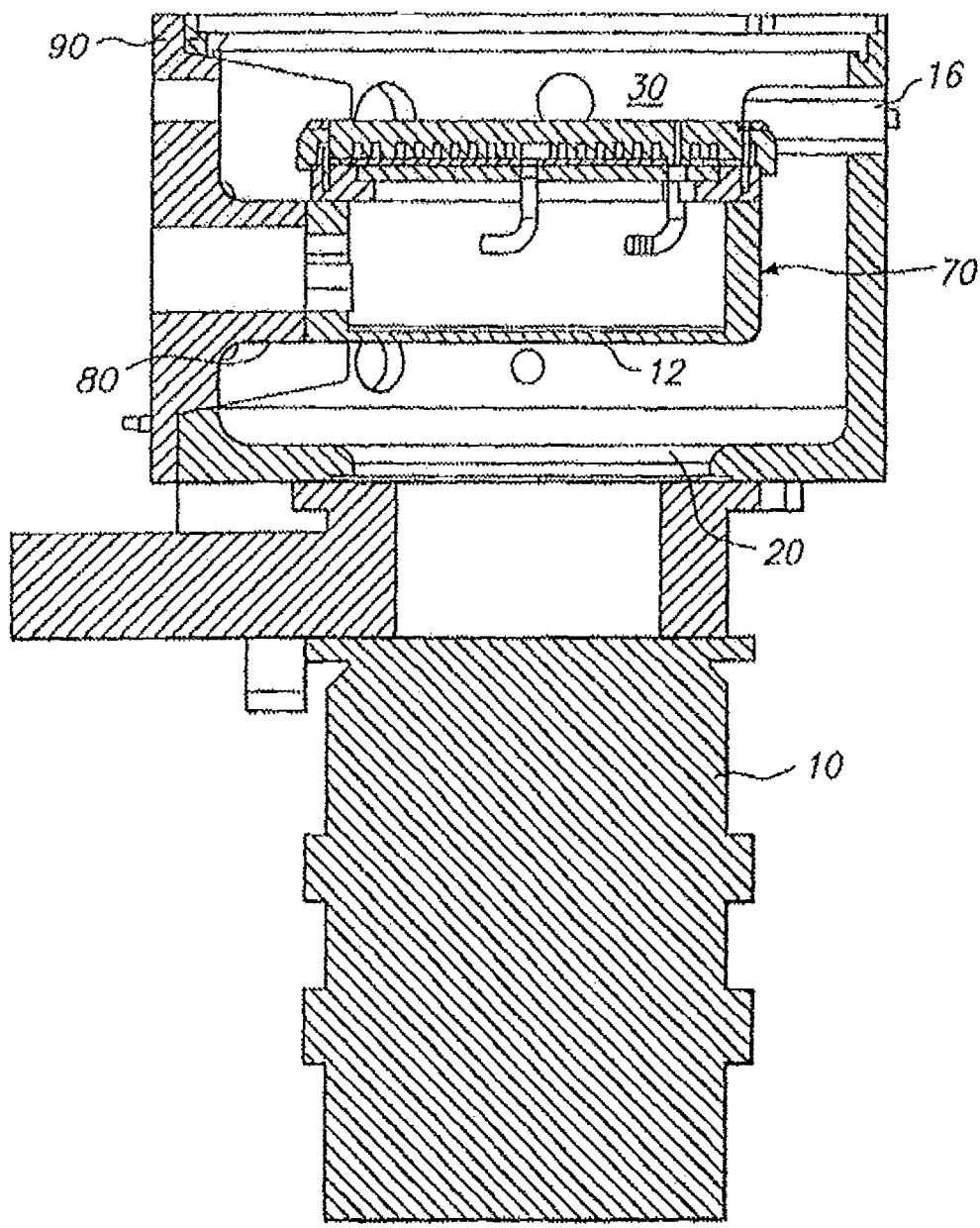
FIG. 1 is a schematic diagram of a construction of a plasma processing apparatus.
Figure 2:
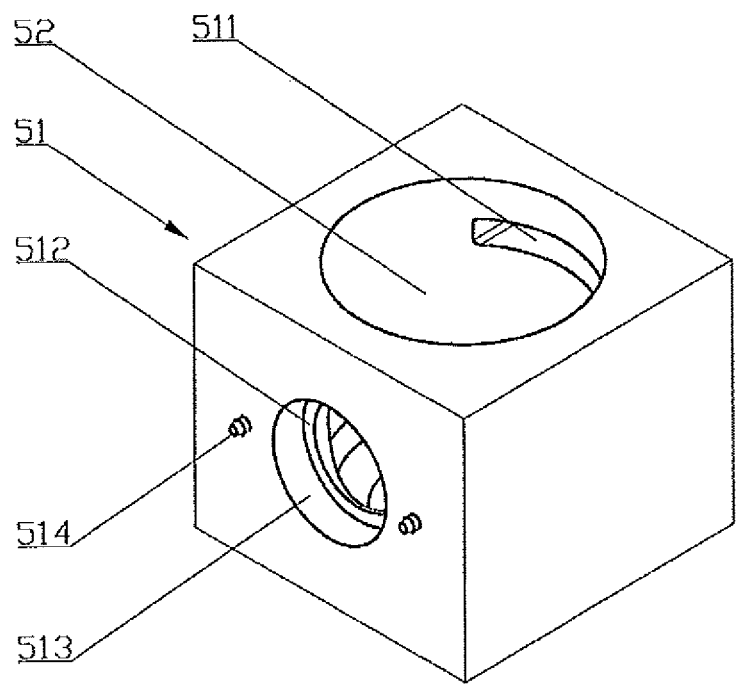
FIG. 2 is a schematic diagram of a construction of an embodiment of an outer shell provided by the present invention.
Figure 3:
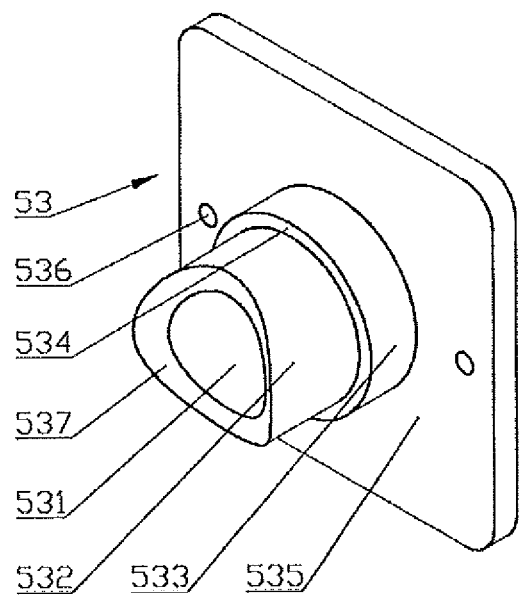
FIG. 3 is a schematic diagram of a construction of an embodiment of a cantilever support device provided by the present invention.
Figure 4:
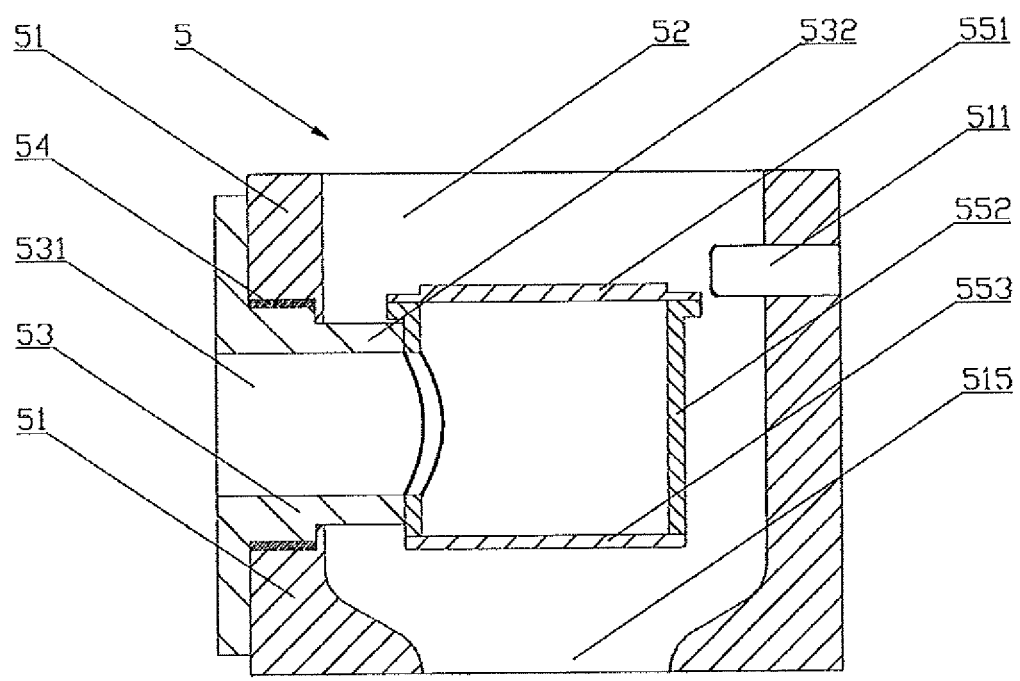
FIG. 4 is a cross-section view of an embodiment of a plasma processing apparatus provided by the present invention.

Referring to FIGS. 2, 3 and 4, FIG. 2 is a schematic diagram of a construction of an embodiment of an outer shell provided by the present invention; FIG. 3 is a schematic diagram of a construction of an embodiment of a cantilever support device provided by the present invention; FIG. 4 is a cross-section view of an embodiment of a plasma processing apparatus provided by the present invention.

In an embodiment, a plasma processing apparatus 5 (shown in FIG. 4) provided by the present invention comprises an outer shell 51. The outer shell 51 is provided with a reaction chamber 52 in the interior. The reaction chamber 52 comprises a top wall (for example a dielectric window, not shown in the figure) on the top. RF energy is coupled into the reaction chamber 52 through the top wall, and gases can also enter the reaction chamber 52 through the top wall. The outer shell 51 further comprises a transmitting port 511, through which a workpiece can be introduced into/out of the reaction chamber 52. The outer shell 51 comprises an exit 515 on the bottom, through which by-products of the physical or/and chemical reactions in the reaction chamber 52 are drawn out.

The outer shell 51 comprises a through-hole going through a side wall of the outer shell 51, whose cross-section is substantially circular. The through-hole may be a stepped hole or a normal through-hole. As shown in FIG. 2, an annular step plane 512 of the stepped hole faces towards the outside of the outer shell 51, and apparently, an annular inner wall 513 of the stepped hole is located outside the step plane 512.

A cantilever support device 53 laterally goes through the side wall of the outer shell 51. For example, the cantilever support device 53 can be inserted into the above-mentioned through-hole of the outer shell 51. The cantilever support device 53 should be pivotally arranged on the side wall of the outer shell 51, that is, the cantilever support device 53 should be able to rotate in the outer shell 51, and an angle of the rotation is commonly not less than 180 degree.

The cantilever support device 53 can be pivotally arranged on the outer shell 51 in several specific ways. Among these ways, a simple and reliable way is to arrange a bearing 54 (shown in FIG. 4) between the cantilever support device 53 and the outer shell 51.

As shown in FIG. 3, the cantilever support device 53 may have a circular axial plane 533. An inner ring of the bearing 54 may be brought in to cover the outside wall of the circular axial plane 533, and an outer ring of the bearing 54 may be mounted into the annular inner wall 513 of the stepped hole. The inner ring of the bearing 54 and the circular axial plane 533 or the outer ring of the bearing 54 and the annular inner wall 513 of the stepped hole are not closed tightly to each other, thus the cantilever support device 53 may properly move relative to the outer shell 51 along the axis direction of the cantilever support device 53.

In order to provide protecting leak tightness between the cantilever support device 53 and the outer shell 51, a sealing device, for example a sealing gasket, may be further arranged between them.

In a case where the through-hole on the side wall of the outer shell 51 is a stepped hole, an annular step plane 534 may be arranged on an inner side of the circular axial plane 533 of the cantilever support device 53. When in an assembly state, the step plane 534 faces towards the inside of the outer shell 51, and an outer diameter of the step plane 534 is bigger than an inner diameter of the step plane 512 of the stepped hole. At this time, the sealing device above-mentioned may be arranged between the step plane 534 of the cantilever support device 53 and the step plane 512 of the stepped hole. In such a way, the bearing 54 may be reliably separated from the plasma environment so as to avoid corrosion of the bearing 54 and to significantly increase the life-span of it.

Further, the bearing 54 may be a magnetic fluid sealing bearing. At this time, the sealing device above-mentioned may be omitted to simplify the construction.

A part of the cantilever support device 53 located in the reaction chamber 52 is a connection arm 532. A bottom electrode is fixed at an end of the connection arm 532, as shown in FIG. 4. The bottom electrode comprises a box body 552, a support element 551 located on the top of the box body 552 (for supporting workpieces) and a cover board 553 located on the bottom of the box body 552. Thus, the cantilever support device 52 and the bottom electrode are rotatablely supported by the side wall of the outer shell 51, In order to connect the connection arm 532 to the bottom electrode more reliably, an end surface 537 (shown in FIG. 3) of the connection arm 532 may has a curvature adapted to an outer wall of the bottom electrode.

Furthermore, in the interior of the cantilever support device 53, there may be a central cavity 531 extending along the axis direction of the cantilever support device 53. The central cavity 531 may serve as a channel for connecting electric lines, cooling water way and RF lines of the bottom electrode to the outside.

In order to selectively fix the relative position of the cantilever support device 53 and the outer shell 51, the plasma processing apparatus provided by the present invention further comprises a locating device. There are several embodiments for the locating device. As shown in FIG. 3, the locating device may specifically comprises a flange part 535 fixed on an outer end (an end out of the outer shell 51) of the cantilever support device 53. Corresponding positions of the flange part 535 and the side wall of the outer shell 51 are correspondingly provided with pin-holes 536 and locating pins 514 respectively (shown in FIG. 2). Apparently, the locating pins 514 may be provided on the flange part 535 and the pin-holes 536 may be provided in the outer shell 51.

The relative position of the cantilever support device 53 and the outer shell 51 is fixed under a normal operation state. The plasma processing apparatus is under a state as shown in FIG. 4. At this time, the locating pins 514 are located in the pin-holes 536, and the cantilever support device 53 can not be rotated.

Figure 5:
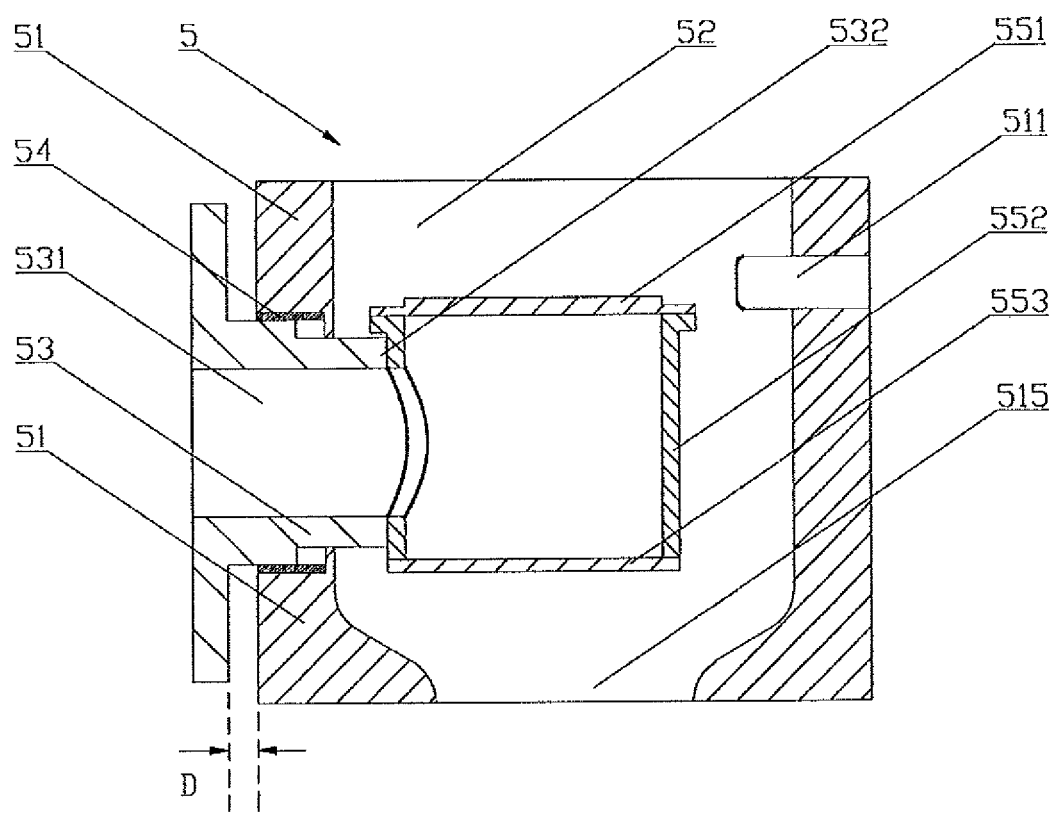
FIG. 5 is a cross-section view of a cantilever support device and an outer shell of the plasma processing apparatus shown in FIG. 4 in a state where the fixed connection relation is released.

When a maintenance operation is performed, the cantilever support device 53 needs to be rotated. The cantilever support device 53 may be pulled out from the outer shell 51 for a distance D so as to separate the locating pins 514 from the pin-holes 536. At this time, the plasma processing apparatus 5 is under a state as shown in FIG. 5. After the locating pins 514 has been separated from the pin-holes 536, the cantilever support device 53 can be rotated, thus the bottom electrode can be rotated along with it.

Figure 6:
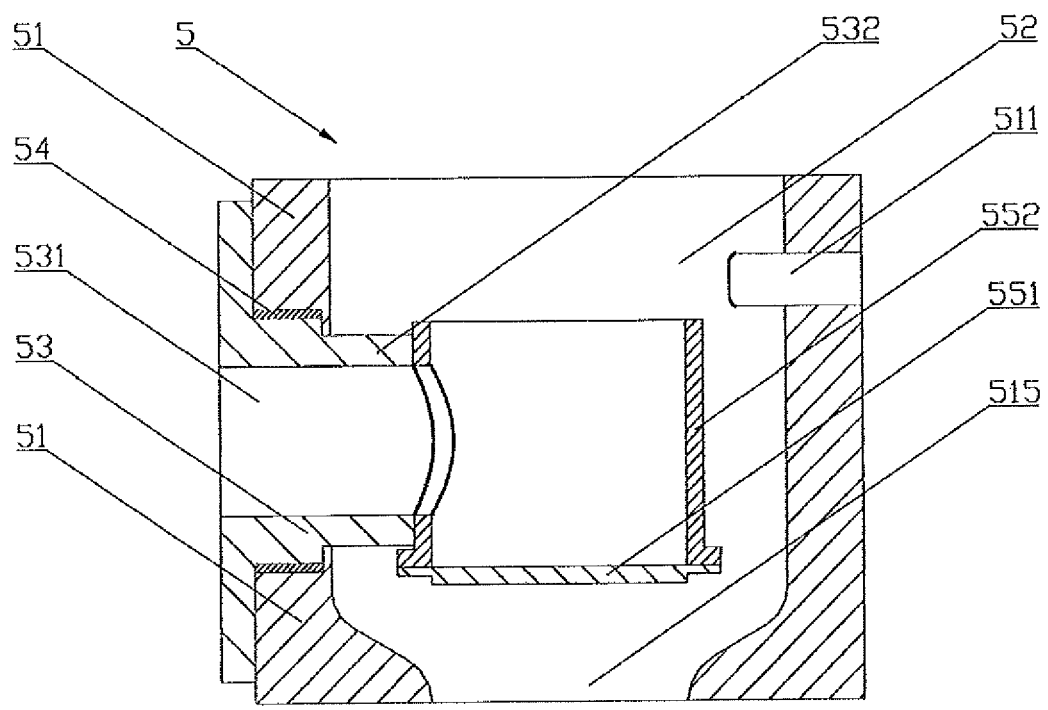
FIG. 6 is a cross-section view of the plasma processing apparatus shown in FIG. 4 in a state where a bottom electrode is maintained.

When the bottom electrode is rotated about 180 degree along with the cantilever support device 53, the cantilever support device 53 is pushed into the outer shell 51 for a distance D. At this time, the locating pins 514 can re-enter into the pin-holes 536, and the relative position of the cantilever support device 53 and the outer shell 51 is re-fixed. The plasma processing apparatus 5 is under a state as shown in FIG. 6. In the state shown in FIG. 6, the support element 551 of the bottom electrode is located on the bottom of the box body 552, and the cover board 553 (already removed in FIG. 6) of the bottom electrode is located on the top of the box body 552. After the cover board 553 and the related parts on the top of the reaction chamber 52 have been removed, an operator can perform a maintenance operation from above on the related parts in an inner cavity of the bottom electrode.

After the main maintenance operation is finished, the cover board 553 and the related parts on the top of the reaction chamber 52 can be remounted, and then the cantilever support device 53 is pulled out from the outer shell 51 for a distance D again so as to separate the locating pins 514 from the pin-holes 536. The plasma processing apparatus 5 will be under the state as shown in FIG. 5 again. After a 180 degree rotation, the relative position of the cantilever support device 53 and the outer shell 51 is fixed by the locating pins 514 and the pin-holes 536. At this time, the plasma processing apparatus 5 is recovered into the normal operation state as shown in FIG. 4. The overall maintenance operation is finished.

In the maintenance operation above-mentioned, a step of taking the bottom electrode out of the reaction chamber 52 is omitted for the plasma processing apparatus 5, and the presence of such a step is one important reason for the maintenance operation of the prior art plasma processing apparatus being relatively complex. Thus, the plasma processing apparatus provided by the present invention simplifies the maintenance operation significantly, save the maintenance cost and the maintenance time, and increases the service efficiency of the plasma processing apparatus significantly.

Figure 7:
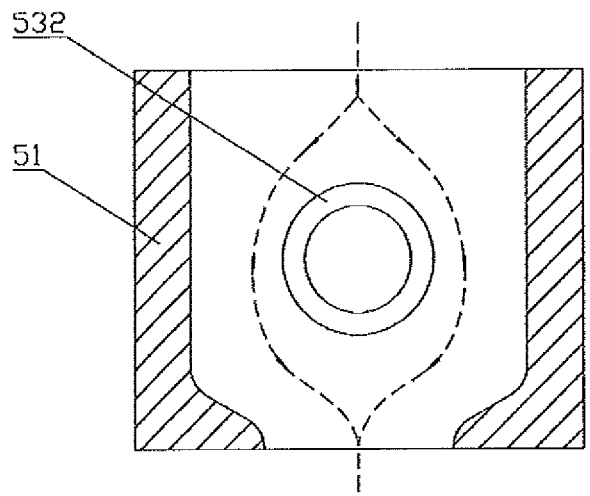
FIG. 7 is a schematic diagram of gas-flow directions in an embodiment of the plasma processing apparatus provided by the present invention.
Figure 8:
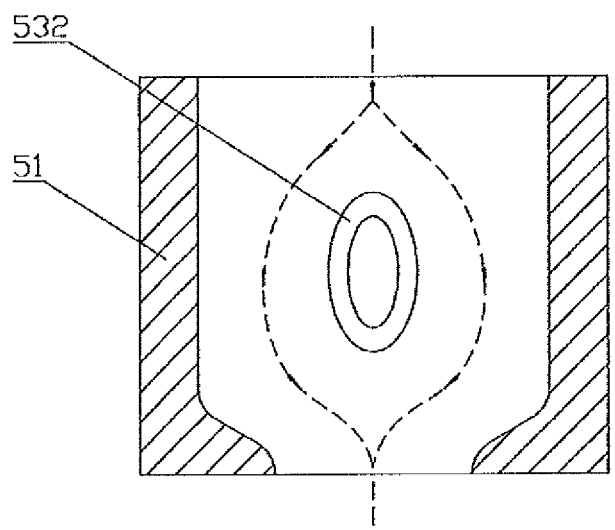
FIG. 8 is a schematic diagram of gas-flow directions in another embodiment of the plasma processing apparatus provided by the present invention.

Referring to FIGS. 7 and 8, FIG. 7 is a schematic diagram of gas-flow directions in an embodiment of the plasma processing apparatus provided by the present invention; FIG. 8 is a schematic diagram of gas-flow directions in another embodiment of a plasma processing apparatus provided by the present invention. The gas-flow directions are indicated schematically by broken lines with an arrow in both figures.

It is well known that the uniformity of gas distribution in the reaction chamber 52 directly affects the uniformity of plasma distribution, and the later is a key factor which relates to the uniformity of surface treatment of workpieces. The uniformity of gas distribution in the reaction chamber 52 becomes more and more important with an increased size of the workpiece and a decreased critical dimension.

Since gas commonly enters from the top of the reaction chamber 52, the presence of the connection arm 532 of the cantilever support device 53 disadvantageously affects the uniformity of gas in radial directions of the reaction chamber 32 to a certain degree. Although it is hard to fundamentally eliminate the disadvantageous effect, measures may be adopted to minimize it.

In order to provide an enough space for successfully connecting electric lines, cooling water way and RF lines of the bottom electrode to the outside via the inner cavity of the connection arm 532, the cross-sectional area of the connection arm 532 can not be too small, but the shape of the cross section of the connection arm 532 may be improved. For example, the size of the connection arm 532 may be as small as possible and the cross section of the connection arm 532 may be set to be circular (FIG. 7). Comparing with a substantial square cross section in the prior art, a circular cross section can significantly decrease an interference to gas flowing downwards from both sides of the connection arm, thus the non-uniformity of the gas in radial directions of the reaction chamber 32 may be decreased.

As shown in FIG. 8, the cross section of the connection arm 532 may be further set as an ellipse. Under a normal operation state, the major axis of the ellipse substantially vertically extends. The width of the connection arm 532 is a major factor of interfering gases. The width of the connection arm 532 may be significantly decreased by setting the shape of the cross section of it as an ellipse, while a big enough inner space may be provided. Thus, the non-uniformity of the gas in radial directions of the reaction chamber 32 may be further decreased.

The plasma processing apparatuses provided by the present invention have been described above. Here, specific examples are used to describe the theories and embodiments of the present invention. The description of the embodiments above is only for the purpose of helping to understand the methods and spirit of the present invention. It should be noted that many improvements and modifications may be applied to the present invention without departing from the theory the present invention for the persons skilled in the art. These improvements and modifications are also covered by the scope of the claims of the present invention.

The invention claimed is:

1. A plasma processing apparatus comprising:
   an outer shell provided with a reaction chamber in the interior; a side wall of the outer shell being provided with a circular stepped hole having a step plane facing towards the outside;
   a bottom electrode arranged in the reaction chamber, a top of the bottom electrode being provided with a support element to support a workpiece, and a bottom of the bottom electrode being provided with a detachable cover board; and
   a cantilever support device laterally going through the side wall of the outer shell, the cantilever support device having a circular step plane, and the circulars plane being received by the stepped hole of the side wall, an inner end of the cantilever support device being located in the reaction chamber and supporting the bottom electrode; characterized in that the cantilever support device is pivotally mounted on the side wall of the outer shell so as to rotate in the outer shell to drive the bottom electrode to rotate in the reaction chamber; the plasma processing apparatus further comprises a locating device for fixing a relative position of the cantilever support device to a position of the outer shell during the maintenance operation so as to switch the bottom electrode between at least a maintenance state and a process state; wherein in the process state, the support element is disposed upwards for process operation to the workpiece, and in the maintenance state, the cover board is disposed upwards for a maintenance operation to the bottom electrode.

2. The plasma processing apparatus according to claim 1, characterized in that the cantilever support device is pivotally mounted on the side wall of the outer shell by a bearing.

3. The plasma processing apparatus according to claim 2, characterized in that a sealing component is arranged between the cantilever support device and the outer shell.

4. The plasma processing apparatus according to claim 3, characterized in that the bearing is arranged in the circular stepped hole; the sealing component is particularly a sealing ring and is arranged between the cantilever support device and the step plane of the circular stepped hole.

5. The plasma processing apparatus according to claim 2, characterized in that the bearing is a magnetic fluid sealing bearing.

6. The plasma processing apparatus according to claim 1, characterized in that the cross section of a part of the cantilever support device located in the reaction chamber has a shape of circle.

7. The plasma processing apparatus according to claim 1, characterized in that the cross section of a part of the cantilever support device located in the reaction chamber has substantially a shape of ellipse, and the major axis of the ellipse substantially vertically extends under a normal operation state.

8. The plasma processing apparatus according to claim 1, characterized in that the cantilever support device comprises a cavity extending along the axis direction of the cantilever support device in the interior, and the cavity is communicated with an inner cavity of the bottom electrode.

9. The plasma processing apparatus according to claim 1, characterized in that the locating device includes a flange part fixed on an outer end of the cantilever support device, and the flange part and the outer shell are respectively provided with locating pins and pin-holes matching each other.

* * * * *